United States Patent [19]

Browne et al.

[11] Patent Number: 5,232,815

[45] Date of Patent: Aug. 3, 1993

[54] AUTODEPOSITION EMULSION AND METHODS OF USING THEREOF TO SELECTIVELY PROTECT METALLIC SURFACES

[75] Inventors: Alan R. Browne, Columbia; Daniel J. Hart, Baltimore; Alan F. Becknell, Jessup; all of Maryland; Betsy Elzufon, Davis, Calif.

[73] Assignee: W. R. Grace & Co.-Conn., New York, N.Y.

[21] Appl. No.: 871,365

[22] Filed: Apr. 20, 1992

Related U.S. Application Data

[60] Division of Ser. No. 621,361, Dec. 7, 1990, which is a continuation-in-part of Ser. No. 451,658, Dec. 15, 1989, abandoned, and a continuation-in-part of Ser. No. 451,680, Dec. 15, 1989, abandoned.

[51] Int. Cl.⁵ ............................................. C23C 26/00
[52] U.S. Cl. .................................. 430/191; 430/285; 427/341; 427/435
[58] Field of Search ................ 427/435, 341; 430/191, 430/285

[56] References Cited

U.S. PATENT DOCUMENTS

| 3,873,349 | 3/1975 | Kimura et al. . | |
|---|---|---|---|
| 3,954,587 | 5/1976 | Kokawa | 430/327 |
| 4,040,925 | 8/1977 | McGinniss | 204/181.6 |
| 4,103,049 | 7/1978 | Nishida | 427/435 |
| 4,104,424 | 8/1978 | Steinbrecher | 427/435 |
| 4,177,177 | 12/1979 | Vanderhoff | 524/375 |
| 4,177,180 | 12/1979 | Hall | 523/334 |
| 4,186,219 | 1/1980 | Hall . | |
| 4,191,676 | 3/1980 | Hall | 427/435 |
| 4,214,022 | 7/1980 | Kunnen et al. . | |
| 4,215,162 | 7/1980 | Kunnen et al. . | |
| 4,310,450 | 1/1982 | Wang et al. . | |
| 4,313,983 | 2/1982 | Chaker et al. . | |
| 4,347,172 | 8/1982 | Nishida et al. . | |
| 4,366,195 | 12/1982 | Hall | 427/435 |
| 4,411,950 | 10/1983 | Smith . | |
| 4,554,305 | 11/1985 | Hall . | |
| 4,578,419 | 3/1986 | Hall . | |
| 4,632,900 | 12/1986 | Demmer et al. . | |
| 4,637,839 | 1/1987 | Hall | 427/435 |
| 4,758,621 | 7/1988 | Broadbent . | |

FOREIGN PATENT DOCUMENTS

| 194824 | 7/1986 | European Pat. Off. . | |
|---|---|---|---|
| 9018840 | 6/1991 | PCT Int'l Appl. | 427/435 |

OTHER PUBLICATIONS

Prieve et al., "Chemiphoresis-A Method for Deposition of Polymer Coatings without Applied Electric Current", *Ind. Eng. Chem. Prod. Res. Dev.*, 17, pp. 32-36 (1978).

*Primary Examiner*—Shrive Beck
*Assistant Examiner*—Vi Duong Dang
*Attorney, Agent, or Firm*—Beverly K. Johnson

[57] ABSTRACT

A coating of resin and photoactive functionality is autodeposited from an emulsion onto a metallic substrate in order to selectively protect the substrate from corrosive environments such as etchant processes. An acid and oxidizing agent are included in the emulsion so that when the substrate is immersed in the emulsion the resin and photoactive functionality autodeposits. The resulting coating can be exposed to actinic radiation in an image-wise fashion and developed in an alkaline solution to develop the image created. In instances where the emulsion and process are used to make circuit boards, the metallic surface uncovered during developing is then etched away, leaving only the coated sections of the surface. The resulting coated surfaces will be the circuit traces of the circuit board.

47 Claims, No Drawings

AUTODEPOSITION EMULSION AND METHODS OF USING THEREOF TO SELECTIVELY PROTECT METALLIC SURFACES

RELATED APPLICATIONS

This is a division of application Ser. No. 621,361, filed Dec. 7, 1990 which is a continuation-in-part of an application having Ser. No. 451,658, filed Dec. 15, 1989, Browne et al. now abandoned, and an application having Ser. No. 451,680 filed Dec. 15, 1989, Elzufon et al now abandoned.

FIELD OF THE INVENTION

Generally, the invention relates to autodeposition emulsions and a method of selectively coating metallic surfaces therewith, especially those surfaces which are subjected to etchant baths as the surfaces are being processed as circuit traces for electronic circuit boards.

BACKGROUND

In many instances, it is desirable to coat metallic surfaces so as to protect the surfaces from corrosive environments. For instance, automobile underbodies are coated to protect them from road salt compounds. Marine vessel parts are coated to protect them from the marine air. In those instances, a polymer coating is applied to the entire surface of the substrate, or, in the alternative, a prepolymer coating is applied to the substrate and then polymerized in toto.

In addition, it is also desirable to selectively protect certain areas of a metallic surface. One such instance is the selective protection of metallic surfaces being processed as circuit traces for electronic circuit boards. In those instances, only certain preselected areas of the metallic surface are coated by a polymeric film.

Specifically, circuit traces can be made by using either of two photoresist systems in a coating, imaging, developing and etching process. In the first system, the substrates or metallic surfaces are coated with a negative working photoresist which polymerizes upon exposure to actinic radiation. In the second system, the substrate or metallic surface is coated with a positive acting photoresist which becomes soluble in developer solution upon exposure to actinic radiation.

Once either one of the resists have been applied to the surface, the surface is then exposed, to actinic radiation. When using the negative resist, the surface is exposed to radiation through a photographic negative bearing an image of the desired circuit. As a result, the sections of the resist exposed by the radiation become photopolymerized and thus less soluble in a developer solution. Then during the development phase, those sections of resist which were shielded from the radiation, and which thus remain substantially unpolymerized, are dissolved away by means of a suitable solvent that does not dissolve the photopolymerized sections. This stage is known as development because it develops an image of the circuit by uncovering certain sections of the metallic surface. After development, the uncovered metal surface is etched to form a printed circuit. The photopolymerized resist may then be stripped chemically by means of a solvent, leaving a circuit pattern formed from the unetched metal surface.

When using the positive resist, the coated surface is exposed to radiation through a positive image of the desired circuit. The exposed areas of the coating are thus rendered more soluble and subsequently removed in a developing solvent. As done when using the negative resist, the metal surfaces left uncovered during development are etched, thus leaving a positive image of the desired circuit.

Photoresists have become important tools when preparing circuit boards having plated through holes. Such holes are being increasingly used as circuit boards are increasingly being made with two conductive sides. The additional conductive surface increases the boards' capabilities.

The above-described two sided boards are conventionally made from a laminate consisting of copper/epoxy/copper sheets. Each copper side of the laminate has a circuit etched onto it. The two sides are connected electrically, as required for the particular circuits involved, by small apertures or "through holes". Other terms used in the art are "component holes" or "vias." Through holes, as initially drilled or otherwise formed, are not electrically conductive because of the intervening insulating epoxy layer. Accordingly, the holes' interiors must be coated with copper to electrically connect the two copper sheets. This copper coating can be applied by electroless copper deposition, thus forming one type of plated through hole (PTH). Another type of PTH includes those holes which have copper electrolytically deposited thereon after the initial electroless deposition of copper. See Norman S. Einarson, *Printed Circuit Technology* (published by Printed Circuit Technology, 1977); Fisher, G. L.; Sonnenberg, W., & Bernards, R.; "Electroplating of High Aspect Ratio Holes " *Printed Circuit Fabrication*, Vol. 12, No. 4 (April, 1989) pp.39–66; D'Ambrisi, J. J. et al., "The Chemistry of Plating Small Diameter Holes", Part II; *Printed Circuit Fabrication*, Vol. 12, No. 8 (Aug., 1989) pp.30–42.

Some of the difficulties in making circuit boards begin with those copper-coated holes. After the holes are created and plated with copper, the laminate is subjected to the etchant operations that tend to attack the copper coatings within the holes. Accordingly, the art has developed various methods for protecting the copper plated holes.

Two methods of protection include (1) paraffin plugs for the holes and (2) tenting with dry and liquid photoresist films. However, paraffin plugs are difficult to handle because of problems in removing the plugs when they are no longer needed. In addition, while tenting has been used with greater success, the problems attendant upon tenting also make its use somewhat awkward.

Tenting works by protecting the plated holes with a dry film comprising a photopolymerizable sheet. The areas of the sheet which cover and protect the holes are exposed to UV radiation and polymerized. The circuit board is then later processed with the plated holes remaining covered by the "tent". The tents are then later removed by proper solvents.

As recognized by those skilled in the art, proper photoimaging of the circuit requires that any protective photopolymerizable coverings used in the process be extremely thin. As a result, when using tenting techniques, the polymerizable tents are thin. However, because of their thinness, these tents tend to be weak and thus are subject to tearing, breaks or "pinholes." Once those flaws form, solvents or etchants can seep through and come in contact with the copper deposited on the through holes' sides, thus destroying the interconnect between the two copper sheets. The same problem occurs when the dry film is laid down improperly, thus allowing etchant solutions and developers to leak underneath the film.

In addition to film flaws, tenting results in the formation of "annular rings" or shoulders on the board's surface. These rings result from the requirement that a tent's diameter must be larger than the hole diameter in order to provide an attachment point for the tent and to afford hole protection. Their formation occurs during the etching process, because, after etching, the tent has not only protected the inner lining of the aperture, but has also protected an annular portion of the metal surface surrounding the aperture.

However, annular rings have become a problem as the trend towards smaller circuit boards and higher density circuits continues. For example, as circuit boards get smaller there will be less space available for the rings on the boards' surfaces. Thus, there will be less surface area onto which the tents can be anchored. Moreover, as more and more circuit traces are designed into the boards, large annular rings are more and more becoming a hindrance to design around. For example, there are some instances where multiple fine line circuits are run parallel and one of the circuit traces will require a connection to the other side of the board. In such an instance, a hole will be required. However, if the annular ring for that hole is too large, the other traces must be diverted away from the hole to avoid a short-circuit. Thus, to avoid designing around the ring, it would be ideal to eliminate their presence altogether.

Further, it is generally recognized that the current resin/photoactive functionality combinations found in common photoresists are capable of resolving smaller features. On the other hand, the current liquid and dry film photoresists do not maximize those capabilities in that to form finer features with a good manufacturing yield it is generally recognized that thinner films with fewer defects than those provided by current liquid and dry film photoresist application methods are needed. However, other known application methods, such as lamination, roll coating, flood screen printing, spraying, dip coating, curtain coating, etc., fail as an appropriate application method as the film thickness decreases below 1 mil. For instance, in order to resolve features as small or smaller than 4 mils, which is currently the state of the art, it is preferable that the film thickness of the protective covering used be 25% or less of the feature size being resolved. However, when attempting to obtain thicknesses less than 1 mil with those methods, a significant number of defects begin to appear in the coating that results.

One method that avoids the above problems is the electrodeposition of a photoresist. For instance, a photoresist coating is applied to the substrate by applying an electric charge to the substrate, which in turn attracts a charged photoresist. See U.S. Pat. Nos. 4,632,900 to Demmer et al. and 3,954,587 to Kokawa. Thus, in electrodeposition a thin film of resist forms directly onto the surfaces of the plated through holes and thus avoids the awkward tenting process of laying the film down, the attendant annular ring formation and the film flaw problem. However, electrodeposition involves additional equipment and time to construct the electrodeposition apparatus. Electrodeposition also consumes electrical power and requires charged resins. Even further, photoresist compositions usually have optimal component ratios at which the components should be applied to the surface. However, by using electrodeposition, preferential deposition of certain charged particles may alter the ratio of components actually deposited. Thus, a method which has the advantages of electrodeposition baths in that the substrate can be effectively coated and protected, but which also avoids the problems encountered when using electrodeposition methods would be desirable.

SUMMARY OF THE INVENTION

Thus, the general object of the invention is to provide a method and emulsion which effectively coats and selectively protects metallic surfaces by inducing the deposition of a protective coating on the surface by simply immersing the surface in an emulsion and then selectively processing the coating so that only certain portions of the surface remain coated. Such a method comprises
(a) immersing the surface in an emulsion comprising
 (i) resin,
 (ii) photoactive functionality,
 (iii) acid,
 (iv) oxidizing agent, and
 (v) surfactant,
 wherein (i)–(v) are present in amounts and the surface is immersed for a period of time sufficient to induce a coating of resin (i) and functionality (ii) on said metallic surface;
(b) exposing said coating of resin (i) and functionality (ii) to actinic radiation in an image-wise fashion; and
(c) immersing said exposed coated surface from (b) above in a developer to develop an image on said surface.

It is a particular object of the invention to provide a method and emulsion capable of selectively protecting a metallic surface being processed to make electrical circuit traces, wherein the method comprises
(a) immersing the surface in an emulsion comprising
 (i) resin,
 (ii) photoactive functionality,
 (iii) acid,
 (iv) oxidizing agent, and
 (v) surfactant,
 wherein (i)–(v) are present in amounts and the surface is immersed for a period of time sufficient to induce a coating of resin (i) and functionality (ii) on said metallic surface;
(b) exposing said coating of resin (i) and functionality (ii) to actinic radiation in an image-wise fashion;
(c) immersing said exposed coated surface from (b) above in a developer solution to develop an image on said surface;
(d) immersing the developed surface from (c) in an etchant bath to remove metallic surfaces which were uncovered during step (c); and
(e) stripping any remaining coating in a solvent.

These and other objects will become apparent from the following detailed description of the invention.

DETAILED DESCRIPTION

The emulsion described above can be defined as an autodeposition bath. These types of baths have been described in the art and are termed as such because they deposit a coating on a metal surface by physical contact, e.g. immersion. They do not require the surface on the coating components in the bath to be electrically charged. See U.S. Pat. Nos. 4,103,049 and 4,347,172 to Nishida et al. and U.S. Pat. No. 4,366,195 to Hall. Briefly, autodeposition baths are water based emulsions comprising resin, a surfactant and a combination of an acid and an oxidizing agent. All of those components are present in amounts sufficient to induce the resin to coat a metal surface when immersed in the bath. Further, such baths deposit coatings in such a manner that the coating grows in thickness with time. The art has described using such baths to coat steel, aluminum, zinc and some copper surfaces.

Contrary to previous autodeposition emulsions in the art, the emulsion described herein contains photoactive functionality and is used to deposit a coating which can selectively protect metal surfaces, especially those surfaces which are being processed for electrical circuit traces. As described above, the emulsion comprises
  (i) resin,
  (ii) photoactive functionality,
  (iii) acid,
  (iv) oxidizing agent, and
  (v) surfactant.

Resins which are suitable for the emulsion include, but are not limited to, acid containing polymers or copolymers of one of the following monomers: styrene, butadiene, isoprene, vinylidene chloride, methyl acrylate, ethyl acrylate, butyl acrylate, methyl methacrylate, ethyl methacrylate, butyl methacrylate, acrylonitrile, acrylic acid, itanoic acid, methacrylic acid, vinyl alcohol, maleic anhydride and vinyl acetate. Specific copolymers include
butadiene/acrylonitrile/methacrylic acid
styrene/acrylic acid
styrene/butadiene/acrylic acid
styrene/butadiene/methacrylic acid
styrene/butadiene/itaconic acid
styrene/butadiene/maleic acid
styrene/butadiene/butylacrylate/acrylic acid
styrene/butadiene/butylacrylate/methacrylic acid
styrene/butadiene/butylacrylate/itaconic acid
styrene/butadiene/butylacrylate/maleic acid
styrene/ethyl acrylate/methacrylic acid
styrene/maleic anhydride
styrene methacrylic acid, and
vinylidene chloride/methacrylic acid.

Resins comprising acid copolymers which have been partially modified by compounds such as simple alkyl alcohols, e.g. acid resins esterfied with butanol, may also be used. Commercially available resins include Joncryl® 67 styrene/acrylic acid copolymer from Johnson Wax, Scripset® 550 from Monsanto and SMA 17352 from Sartomer, both styrene/maleic anhydride copolymers partially esterfied with simple alkyl alcohols.

Other suitable resins include novolak resins derived from an aldehyde, such as formaldehyde, and a phenolic compound, such as phenol or cresol. Suitable examples include HT 9690, from Ciba-Geigy and HRJ 10805 from Schenectady, both cresol novolaks.

For the purposes of this invention, the photoactive functionalities suitable for the emulsion are those functionalities or compounds which are positive or negative acting. As is well known in the art, a positive acting functionality is a functionality or compound which becomes soluble in a developer solution when exposed to actinic radiation. A negative acting functionality is a functionality or compound which polymerizes, and becomes less soluble, when exposed to radiation. As discussed later below, the photoactive functionality can be a functionality or compound separate from the resin, or the functionality can be attached to the resin, e.g. a copolymer product from an additional monomer.

Suitable positive acting photoactive functionalities include, but are not limited to, oxymethylene based monomers, o-nitrocarbinol esters, o-nitrophenyl acetals and polyesters and end-capped derivatives thereof, and benzo- and naphthoquinone diazide sulphonic esters. See U.S. Pat. No. 4,632,900 to Demmer et al. A preferred positive acting functionality is a 4- or 5- sulfonic acid derivative of an orthodiazonaphthoquinone, e.g. a 2-diazo-1-naphthoquinone sulfonate ester. An especially preferred functionality is the 2-diazo-1-naphthoquinone-5-sulfonate triester of 2,3,4-trihydroxybenzophenone. A commercially available adduct is that known as THBP 215 Diazoester from International Photochemicals.

Another preferred positive acting functionality is o-nitrocarbinol ester. This monomer may be polymerized as a homopolymer to form the functionality or, as in one embodiment of the invention, preferably polymerized as part of a copolymer with an unsaturated acid and the same or a different ester. Such copolymers are formed using standard emulsion polymerization techniques described later below. If a nitrocarbinol is used, suitable copolymers therefrom should have a molecular weight of at least 500 and contain in the molecule at least 5% by weight, by reference to the molecular weight, of aromatic carbocyclic or heterocyclic o-nitrocarbinol ester groups of formula

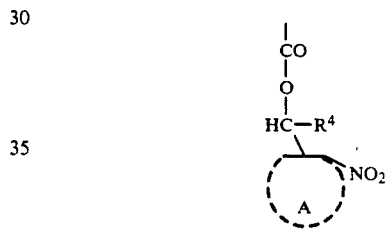

where A denotes an aromatic carbocyclic or heterocyclic ring that may be substituted and has 5 to 14 members, and $R^4$ denotes a hydrogen atom, an alkyl group of from 1 to 8 carbon atoms, or an optionally substituted aryl or aralkyl group, the optional substituents on the groups A and $R^4$ being alkyl or alkoxy groups of from 1 to 8 carbon atoms, halogen atoms, nitro, amino, or carboxylic acid groups.

Suitable ring systems A may be mononuclear or polynuclear, such as benzene, naphthalene, anthracene, anthraquinone, phenanthrene, or pyridine rings.

Examples of suitable aromatic o-nitrocarbinols upon which these o-nitrocarbinol ester groups are based include o-nitrobenzyl alcohol, 2-nitroveratryl alcohol, 6-nitroveratryl alcohol, 2-nitro-4-aminobenzyl alcohol, 2-nitro-4-dimethylaminobenzyl alcohol, 2-nitro-5-dimethylaminobenzyl alcohol, 2-nitro-5-aminobenzyl alcohol, 2-nitro-4,6dimethoxybenzyl alcohol, 2,4-dinitrobenzyl alcohol, 3-methyl-2,4-dinitrobenzyl alcohol, 2-nitro-4methylbenzyl alcohol, 2,4,6-trinitrobenzyl alcohol, 2-nitrobenzhydrol, 2,2'-dinitrobenzhydrol, 2,4-dinitrobenzhydrol, 2,2', 4,4'-tetranitrobenzhydrol, 2-nitro-4-methylaminobenzyl alcohol, 2-nitro-3-hydroxymethyl naphthalene, 1-nitro-2-hydroxymethyl naphthalene, 1-nitro-2-hydroxymethyl anthraquinone, 3-methoxy-4-(2-nitratoethoxy)-6-nitrobenzyl alcohol and 2-nitro-3-hydroxymethyl pyridine.

If desired, photosensitizers such as aromatic ketones and thioxanthones may be included with the positive acting functionalities.

Suitable negative acting photoactive functionalities include, but are not limited to, a variety of photoprepolymers. Generically those prepolymers include, but are not limited to acrylates. More specifically, they include acrylic and methacrylic acid esters of mono-, di-, and polyhydric alcohols; and mono-, di-, and polyalkoxy acrylate and methacrylate.

Also suitable are mono-, di-, and poly- acrylates or methacrylates which are derivatized from the reaction of hydroxyl terminated acrylate or methacrylate esters with mono-, di-, and polyisocyanates, epoxides, and other hydroxy reactive compounds. Specific examples include:

ethylene glycol diacrylate
ethylene glycol dimethacrylate
propylene glycol diacrylate
propylene glycol dimethacrylate
trimethylolpropane triacrylate
trimethylolpropane ethoxylate triacrylate
trimethylolpropane propoxylate triacrylate
trimethylolpropane ethoxylate trimethacrylate
trimethylolpropane propoxylate trimethacrylate
bisphenol A diacrylate
phenoxyethyl methacrylate
hexanediol diacrylate
neopentyl glycol diacrylate
neopentyl propoxylate diacrylate
pentaerythritol triacrylate
dipentaerythritol hydroxypentaacrylate
polyethylene glycol diacrylate Trimethylolpropane ethoxylate triacrylate is available as Photomer® 4149 and 4155 from Henkel Corporation. Other preferred negative acting prepolymers include those known as Sartomer® 454, 205, and 399 from Sartomer Co..

When using the negative acting functionalities described above, it is necessary to use a photoinitiator. Thus hereinafter, unless described otherwise, when the term "photoactive functionality" is specifically used in regards to a negative acting functionality, the term "photoactive functionality" also includes a photoinitiator. Suitable photoinitiators for initiating polymerization of the negative acting photoprepolymers with UV radiation include, but are not limited to, benzoin ethers, benzil ketones, and phenones and phenone derivatives. Examples are:

acetophenone
9,10-anthraquinone
benzil
benzil dimethyl ketal
benzoin
benzoin tetrahydropyranyl ether
benzoin isobutyl ether
benzophenone
benzoyl cyclobutanone
4,4'-bis(dimethylamino)benzophenone
dibenzosuberone
dioctyl acetone
diethoxy acetophenone
methyl ethyl ketone
methyl isobutyl ketone
thioxanthone
xanthone A commercially available photoinitiator used in the Examples below is Irgacure® 651 from Ciba-Geigy.

As mentioned above, resin (i) and the photoactive functionality (ii) may be chemically separate components in the bath or they may be chemically bound. As also mentioned above, an embodiment in which (i) and (ii) are bound can be prepared by emulsion polymerizing a monomer containing the photoactive functionality with another monomer to produce a resin having the photoactive functionality attached thereto, e.g. the nitrocarbinol ester co-polymer. One embodiment is illustrated in Example 1.

Emulsion polymerization techniques, conditions and polymerization initiators are those well known in the art. Known techniques for the addition of monomers in emulsion polymerization techniques include continuous addition or sequential addition of monomer in separate portions. Known surfactants suitable for emulsifying the monomers in aqueous solution include, but are not limited to, 2,4,7,9-tetramethyl-5-decyn-4,7-diol, 3,5-dimethyl-i-hexyn-3-ol, glycerol monostearate, dipropylene glycol monostearate, dipropylene glycol monolaurate, dipropylene glycol monooleate, pentaerythritol monooleate, sodium dioctyl sulfosuccinate, sorbitan monolaurate, sodium lauryl ether sulfate, potassium xylene sulfonate, sodium cumene sulfonate, ethylene glycol monostearate, glycerol, nonyl phenol ethoxylate, polyoxyethylene cetyl ether, N-octadecyl sulfosuccinamate, polypropylene glycol monostearate, 3,6-dimethyl-4-octyn-3,6-diol, dodecyl benzene sodium sulfonate, and sodium lauryl sulfate. When emulsion polymerization is used to prepare a bath, the surfactant used in the polymerization reaction may also serve as surfactant (v) of the emulsion.

Suitable polymerization initiators include free radical generators such as peroxy disulfates- and persulfate-iron-bisulfate or metabisulfate systems. Detailed techniques, methods and conditions for emulsion polymerization are described in F. W. Billmeyer, *Textbook of Polymer Science* (Wiley- Interscience, New York; 2ed 1971); K. Bovey, et al., *Emulsion Polymerization*, (Interscience Publishers, Inc.; New York 1955); and G. M. Dekker, *Kinetics and Mechanisms of Polymerization*, Vol. 1 (Ed. by G. E. Ham 1969).

A preferred embodiment of the emulsion in which resin (i) is not already prepared in emulsion form can be prepared by direct emulsification of (i) and (ii). In some instances, standard emulsion techniques can be used. See U.S. Pat. No. 4,177,177 to Vanderhoff and Kirk-Othner *Encyclopedia of Chemical Technology*, 3rd edition, Volume 8, "Emulsions—Preparation", pp. 919-923. In other instances certain resins and photoactive functionalities may require other emulsion techniques. For instance one preferable technique is a combination of phase inversion and comminution techniques. Specifically, at room temperature, a water-in-oil (w/o) emulsion is formed by preparing resin (i) and photoactive functionality (ii) in solution by mixing (i) and (ii) into organic solvents such as ethyl acetate and then adding to that solution a lesser amount of water, e.g. about fifty percent by weight of the solution. The resulting w/o emulsion is then inverted into an oil-in-water (o/w) emulsion by addition of well known surfactants such as sodium alkyl benzene sulfonates, sodium alkyl sulfates or alky phenol ethoxylates in aqueous solution. In some instances, subsequent additions of surfactants may be needed to complete the inversion. To stabilize the resulting emulsion, the emulsion is comminuted by well known homogenizer or, preferably, ultrasound techniques. Any of the resins described above can be used in this technique.

Another method for forming a mixture of (i) and (ii) is illustrated in Examples 3-14. Specifically, a resin latex can be prepared by the standard emulsion polymerization techniques described above for the above-mentioned resins. The resulting latex contains resin particles which would constitute resin (i) of the emulsion.

The specific latex for this embodiment is not critical. However, latex particles are preferable to use with certain photoactive functionalities because they appear to emulsify the functionality component. In addition, as recognized by those skilled in the art, they can provide acid functionalities to the coating so that when using an alkali developing solution, the uncured coatings can be removed more easily. Further, because the latices are generally made with high molecular weight material, the latices act as fillers to provide a more uniform coating. A wide variety of latices is available and are made from the monomers suitable for preparing resin (i).

Commercially available latices include Darex® 528L from the Organic Chemicals Division of W. R. Grace & Co.-Conn. Acrysol® ASE-75 from Rohm & Haas is also suitable.

When using latices, a surfactant from the group described earlier may be used to emulsify components (i) and (ii) in order to assist the deposition process. A commercially available surfactant used in the Examples herein is Surfynol TG surfactant from Air Products, Inc.

When using any of the above-described methods for preparing the emulsion, the amounts of (i) and (ii) should be sufficient so that the total solids content of the emulsion is in the range of about 1 to 20% by weight.

After the emulsion of (i) and (ii) is formed, acid (iii) and oxidizing agent (iv) are then added to the emulsion. The acid and oxidizing agent include those known in the art of autodeposition. It is thought that the acid and oxidant cause metal from metallic surfaces to dissolve, thus creating metal ions. Those metal ions are believed to destabilize the emulsion near the metallic surface and cause the resin particles in the emulsion to deposit thereon. See U.S. Pat. No. 4,177,180 to Hall. Examples of acids include hydrochloric, hydrofluoric, phosphoric, citric, sulfuric and acetic acids. An example of an oxidizing agent is hydrogen peroxide. The acid should be added in amounts so that the pH of the resulting emulsions is generally in the range of 1-5 and preferably in the range of 1.7-3. In some instances, metal halides such as cupric chloride and ferric chloride can also be used as oxidizing agents. In certain autodeposition baths, it may also be desirable to include a metal salt, such as a metal halide, in the bath even when another oxidizing agent is already included, e.g. $H_2O_2$. For instance, in certain latex-based emulsions, $CuCl_2$ can be used in conjunction with $H_2O_2$ In some instances, the addition of $CuCl_2$ may help induce autodeposition. See Examples 5 and 7-12.

In addition, when using the embodiment comprising preformed resin latices, e.g. those illustrated in Examples 3-14, it was found that certain combinations of acid and oxidizing agents were more suitable than others for preparing suitable autodeposition emulsions. Suitable combinations are illustrated in the Examples below, but other combinations known in the art of autodeposition may also be suitable.

The surfactant (v) used in the autodeposition emulsion can be any of those well known in the art. They include those listed earlier in conjunction with the emulsification techniques and are preferably added in addition to those used when making the emulsions of the resin and photoactive functionality.

The amounts of the emulsion's components, other than the acid, are tabulated below.

| Emulsion Component | Percentage by Weight | |
|---|---|---|
| | Suitable | Preferred |
| resin | 0.5-18.0 | 1.8-9.0 |
| photoactive functionality | 0.1-10.0 | 0.15-8.0 |
| total surfactants | 0.5-5.0 | 1-2 |
| oxidizing agent | 0.05-5.0 | 0.1-1.0 |

Other additives can also be included in the emulsion. The additives can be included as one of the original emulsion forming components or they can be added after the emulsion has been formed, depending on the additive used. Such additives include, but are not limited to, coalescing agents, stabilizers, pigments, flow aids and adhesion promoters. Commercially available stabilizers for negative photoactive functionalities include hydroquinone, p-methoxyphenol, pyrogallol, 2,6-di-t-butyl-4-methylphenol and phenothiazine. Available flow aids include Modaflow® from Monsanto and Lithene PL® from Rivertex. Available pigments and dyes include any of a wide variety, e.g. Neopen Blue 808® from BASF. Suitable coalescing agents are glycol ethers and esters such as PM Acetate® (propylene glycol monomethyl ether acetate) from Eastman Chemical Co. and Butyl Dipropasol® (dipropylene glycol monobutyl ether), Hexyl Carbitol® (hexyloxyethoxy ethanol) and UCAR® ester EEP (ethyl 3-ethoxy propionate) from Union Carbide.

To obtain a coating of (i) and (ii) on a metallic surface, standard autodeposition techniques are used. For instance, the surface is immersed in the emulsion for about 30 seconds to 15 minutes. After the surface has been immersed for a period of time so that the desired coating thickness has been obtained, the coated surface is removed from the emulsion and preferably rinsed and dried.

Subsequently, the coated metallic surface is exposed to actinic radiation in an image-wise fashion. In instances where circuits are being made and positive active functionalities are being used for photoactive functionality (ii), the coating is exposed to radiation through an image bearing transparency such that only the coating on the metal areas to be protected from the etchant bath remain unexposed. If negative acting functionalities are being used, the image-bearing transparency used is such that the coating on the metal areas to be protected from the etchant bath are exposed to the radiation.

Radiation used in the present invention preferably has a wavelength of 200-600 nm. Suitable sources of actinic radiation include carbon arcs, mercury vapor arcs, fluorescent lamps with phosphors emitting ultraviolet light, argon and xenon glow lamps, tungsten lamps, and photographic flood lamps. Of these, mercury vapor arcs, fluorescent sun lamps, and metal halide lamps are most suitable. The time required for the exposure will depend upon a variety of factors which include for example, the individual photoactive groups used in the emulsion, the proportion of these groups in the emulsion, the type of light source, and its distance from the composition. Suitable times may be readily determined by those familiar with photoimaging techniques.

The developer used in the present process is selected according to the nature of the resin and photoactive functionality and photolysis products and may be an aqueous or aqueous organic solution of a base; or an organic solvent or mixture of solvents. The use of a base to form a salt, and hence solubilize the fractions of photoactive functionality or resin remaining in the areas of coating which are to be removed after irradiation, is preferred. Such basic solutions are, typically, 0.25-3.0% by weight sodium or potassium hydroxide or carbonate. After development of the image formed by the radiation, certain areas of the metal surface remain coated, while the other areas are uncovered. For instance, if positive acting functionalities are used the areas of coating which are exposed to radiation are removed to uncover metal surface. On the other hand, when negative acting functionalities are used, the areas of coating unexposed to radiation are removed. Thus, in either instance, the image resulting from development selectively coats and the imaged metal surface can be left "as is" or further processed.

In one embodiment, the selectively coated surface is copper and can be further processed to prepare electrical traces for circuit boards. As mentioned above, the processing step taken would be to process the copper surface in an etching solution. Etching solutions that may be used to remove the uncovered copper metal after development are known in the art and may be varied according to the nature of the metal surface. For example, with a copper surface, an acidic solution of ammonium persulfate, cupric chloride or ferric chloride is usually used. Another cupric chloride etching solution is basic aqueous ammonium hydroxide/cupric chloride.

Other suitable surfaces are copper laminate wherein a copper layer has been laminated onto a reinforcing layer. Suitable reinforcing layers include paper, epoxy, glass reinforced epoxy, polyimide, polytetrafluoroethylene and the like.

After etching a positive resist coated surface, the coating covering the protected metal traces is then exposed to actinic radiation to render the coating soluble. Any exposed positive acting coating is then removed with a stripping solution, usually aqueous NaOH. Exposed negative acting coating is generally removed by a warm (57° F.) spray of 3-5% by weight aqueous sodium hydroxide.

As mentioned above, using the autodeposition emulsion method is useful in protecting conductive apertures or "through holes" in two sided circuit boards. By using an autodeposition method, the surfaces of the conductive metallic linings of these apertures are covered and effectively protected from the etching bath. Thus, the above emulsion provides protection equal to that obtained by electrodeposition, but it is more advantageous in that emf inducing equipment is not needed nor is there a need for an additional process step of connecting the metallic surface to an electrical current. Moreover, resin (i) and functionality (ii) do not need to be processed to contain a charge, nor is there the preferential deposition which results from electrodepositing such charged particles.

Further, in making circuit traces on boards having plated through holes, the positive acting system is sometimes preferable to a negative acting system. For instance, when a negative imaging system is employed to protect the lining of the holes, it is difficult to fully irradiate and polymerize, and thus render insoluble, the coating on the inside surfaces of the apertures. Thus, it is possible that the composition will not be fully resistant to the normal development and etching processes, and the metal lining in the aperture may be etched away, even though this was not intended.

On the other hand, the use of a positive acting functionality avoids the above described problem because the positive phototool is designed to shield the apertures from the actinic radiation. Thus, because unirradiated areas of a positive resist coating are insoluble and remain intact during and after development, linings are protected from the etching bath.

In order to further illustrate the practice of the present invention and the advantages thereof, the following examples are provided. However, these examples are in no way meant to be limitative, but merely illustrative.

EXAMPLE 1

Emulsion Polymerization of Photoactive Functionality

A mixture of 16.6 g of o-nitrobenzyl acrylate, 5.3 g of methyl methacrylate, and 1.9 g of acrylic acid was prepared, with the resulting mixture being divided into and added in five (5) equal portions to a mixture composed of 100 g of distilled water and 0.5 g of sodium bisulfite. Each addition of monomer was preceded by the addition of 3.0 ml of a 10% (by weight) aqueous dodecyl benzene sodium sulfonate and followed by the addition of 1.0 ml of a 10% (by weight) aqueous sodium persulfate. The reaction temperature was maintained between 65°-75° C. The resulting latex contained 15.8% total solids.

To 67.0 g of this latex emulsion was added 0.8 g of hydrofluoric acid, 16.7 g of 30% hydrogen peroxide, and enough distilled water to fill the mixture to 100 ml. A copper-covered, glass-reinforced epoxy laminate submerged in the latex/acid/peroxide composition for five (5) minutes exhibited a coating that, upon removal from the composition, could not be removed by vigorous rinsing with water. The coating was then dried for 10 minutes at 90° C.

The dried coating was covered with a silver halide phototool and exposed for 12 minutes under a 1 kW high-pressure, mercury-xenon, UV light source rich in light of 365 nm. Following this exposure, the coated substrate was immersed in 5.0% (by weight) aqueous sodium hydroxide for 30 seconds, resulting in removal of coating that had been exposed to the UV light, and leaving a positive image of the phototool.

The photoimaged board was then immersed in a hydrochloric acid/cupric etchant bath for five (5) minutes. After removal, the areas of the substrate that had been covered with the coating were protected while the exposed copper had been etched away.

EXAMPLE 2

A mixture of 8.9 g vinylidene chloride and 41.4 g 0-nitrobenzyl acrylate was added dropwise (30 to 60 drops per minute) into a resin kettle containing 120.0 ml deionized water, 10.0 ml of 10% by weight aqueous sodium dodecylbenzene sulfonate, 1.0 g sodium bisulfite, and 0.01 g ammonium iron(II) sulfate. The kettle mixture was stirred mechanically. Concurrently, a mixture of 30.0 ml deionized water and 1.0 g sodium persulfate was added dropwise (5 to 10 drops per minute) to the kettle. Before, during, and after the additions, the kettle temperature was maintained at 42° C. The stirring and heating continued for one hour after both additions were complete. The result was a latex emulsion containing 22.4% total solids by weight.

44.6 g of this emulsion were mixed with a solution of 50.9 ml deionized water, 1.2 g of 85% phosphoric acid, and 3.3 g 30% hydrogen peroxide. A clean copper laminate was immersed in the resulting autodeposition bath for 5 minutes. The laminate was then removed from the bath, rinsed, and dried at 90° C. for 5 minutes. A 0.3 mil coating was observed on the laminate. This coating was then shielded with a silver halide phototool and exposed to UV light for 12 minutes. Successful development of the coating was accomplished in 5-6 minutes, using 5% NaOH. Etching in a cupric chloride etchant resulted in copper traces having the image of the phototool.

EXAMPLE 3

Latex Emulsion of Photoactive Functionality

Resin Latex: 50 g Darex 528 L styrene butadiene methacrylic acid copolymer
Photoactive Functionality: 75 g trimethylolpropane triacrylate (TMPTA) and 2.5 g Irgacure ® 651 photoinitiator
Surfactant: 10 g Surfynol TG The components above were prepared in an emulsion by first blending the above amounts of latex and surfactant in 100 ml of water. Second, the photoactive functionality components were added with subsequent addition of 100 ml of water and high speed blending for 3 to 5 minutes. The blended mixture was diluted to 1000 ml with deionized (DI) water.

EXAMPLE 4

To 100 ml of the emulsion prepared in Example 3, 1 g of hydrofluoric acid (HF) and 1 g of hydrogen peroxide ($H_2O_2$) were added. A copper panel was immersed in the resulting emulsion for 10 minutes. Deposition of coating on the copper was observed. Coatings from the emulsion were found to be photoimagable and etch resistant.

EXAMPLE 5

0.5 g of cupric chloride ($CuCl_2$) was added to the deposition bath prepared according to Example 4. A 0.2 mil coating was deposited after immersion of a copper panel for 10 minutes followed by a water rinse. The deposited coating was found to be photoimageable and etch resistant.

EXAMPLE 6

3 g phosphoric acid and 1 g $H_2O_2$ were added to 100 ml of the emulsion prepared according to Example 3. A coating less than 0.1 mil was deposited on a copper panel after the panel had been immersed for 10 minutes and was found to be photoimageable and etch resistant.

EXAMPLE 7

0.5 g $CuCl_2$ was added to the emulsion prepared according to Example 6. A 0.15 mil coating was deposited on a copper panel which had been immersed for 10 minutes. The coating was both photoimageable and etch resistant.

EXAMPLE 8

Resin Latex: 25 g Darex 528 L
Photoactive Functionality: 38 g Photomer 4149 ethoxylated TMPTA from Henkel Corporation and 1.75 g Irgacure 651 photoinitiator
Surfactant: 5 g Surfynol TG The processing steps used to make the emulsion according to Example 3 were used except the above was diluted to a 500 ml emulsion.

To 100 ml of the emulsion prepared above, 1 g HCl, 1 g $H_2O_2$ and 0.5 g $CuCl_2$ was added. A photoimageable and etch resistant coating deposited on a copper panel which had been immersed in the bath for 10 minutes.

EXAMPLE 9

Resin Latex: 1.75 g Darex 528 L
Photoactive Functionality: 1.9 g TMPTA, 38 g Photomer 4155 and 1.75 g Irgacure 651 photoinitiator
Surfactant: 5 g Surfynol TG The processing steps used to make an emulsion described in to Example 3 were used except the above was diluted to a 500 ml emulsion.

To 100 ml of the emulsion prepared above, 3.8 g citric acid, 1 g $H_2O_2$ and 0.5 g $CuCl_2$ were added. A copper panel was immersed in the resulting bath for 10 minutes, resulting in the deposition of a photoimageable and etch resistant coating on the panel.

EXAMPLE 10

An emulsion was prepared according to Example 9 except 38 g of Photomer 4149 was used instead of Photomer 4155. The components for the bath were diluted to 500 ml.

To 100 ml of the emulsion prepared above, 3.8 g citric acid, 1 g $H_2O_2$ and 0.5 g $CuCl_2$ were added. A copper panel was immersed in the resulting bath, resulting in the deposition of a 0.40 mil thick coating which was photoimageable and etch resistant.

EXAMPLE 11

An emulsion was prepared with the following components:
Resin Latex: 25 g Darex 528 L
Photoactive Functionality: 38 g dipentaerythrit hydroxy pentaacrylate and 1.75 g Irgacure 651 photoinitiater
Surfactant: 5 g Surfynol TG The above components were mixed together according to the steps described in Example 3, except the above components were diluted to 500 ml.

To 100 ml of the emulsion prepared above, 1 g HCl, 1 g $H_2O_2$ and 0.25 g $CuCl_2$ were added. A copper panel was immersed in the resulting bath, resulting in a 0.2 mil thick coating which was photoimageable and etch resistant.

EXAMPLE 12

An emulsion was prepared according to Example 11, except 38 g of pentaerythritol triacrylate was added instead of dipentaerythritol hydroxypentaacrylate. The above components were diluted to 500 ml.

To 100 ml of the emulsion prepared above, 1 g HCl, 1 g $H_2O_2$ and 0.25 g $CuCl_2$ were added. A copper panel was immersed in the resulting bath, resulting in a 0.2 mil thick coating which was photoimageable and etch resistant.

EXAMPLE 13

A liter of emulsion was prepared as follows: 10 g of Irgacure 651 was dissolved in 50 g of Photomer 4149. This was added to 375 ml of Acrysol ® ASE-75 aqueous acrylic emulsion (150 g solids) made by Rohm & Haas Company, in a blender. Enough water was then added to make 1 liter of solution. The resulting solids content of this emulsion was 21%.

Deposition baths were prepared from the above-described emulsion as follows:

a. 3 g of 30% $H_2O_2$ was added to 100 mls of emulsion. A 10% phosphoric acid solution was used to titrate this solution to a pH of 1.8.

b. 150 g of 30% $H_2O_2$ was added to 5 liters of emulsion. Concentrated phosphoric acid was used to titrate this bath to a pH of 1.8.

In 100 ml of bath a., 1"×1½" copper coupons were immersed for 1, 3, 5 and 10 minutes. Deposition, as measured by weighing, increased with time. Approximately 1 mil of polymer was deposited in 1 minute at these conditions. Agitation was by mild stirring. In the 5-liter bath b., 50 6"×6" circuit boards were coated sequentially for 2 minutes. Coating thickness varied from 2 mils initially to 1 mil at the end. Agitation was accomplished by moving the board back and forth gently. These boards were then dried at 80° C. for 5-10 min., contact imaged at 80 mj and developed in 1% $Na_2CO_3$. All coatings were etch resistant.

EXAMPLE 14

Emulsions were prepared as in Example 13 except for substituting hydrofluoric, sulfuric, or citric acid for the phosphoric acid. The pH was maintained at 1.8 for all examples. The resulting emulsions were all acceptable but the emulsion containing phosphoric acid was preferred because it gave more polymer deposition per unit amount of copper removed by the microetchant. In other words, that emulsion was more efficient.

EXAMPLE 15

Emulsification of Resin and Photoactive Functionality

A solution of 34 g Ciba Geigy HT9690 novolak resin and 6 g International Photochemicals THBP-215 Diazo Ester (2,3,4-trihydroxybenzophenone 2-diazo-1-naphthoquinone-5-sulfonate, 54% triester) in 60 g ethyl acetate and 10 g PM Acetate from Eastman Chemical was prepared. The solution was stirred while a mixture of 1.5g Polystep A16-22 surfactant from Stepan and 100 g water was added drop-wise. A water-in-oil emulsion resulted.

A mixture of 0.5 g Triton X-100 nonionic surfactant from Rohm and Haas and 20 g water was then dripped in resulting in an oil-in-water (o/w) emulsion before sonicating the emulsion for 2 minutes at about 180 W estimated intensity with a Sonics and Materials 500 W cell disrupter with a ¾" high gain Q horn. The low boiling ethyl acetate solvent was removed on a rotary evaporator. The resulting o/w emulsion contained 31.7% solids following concentration.

A deposition bath was then prepared by diluting the emulsion to 10% solids with water, acidifying to pH 1.8 with phosphoric acid, and adding an amount of hydrogen peroxide equal to 1% of the total bath weight. A copper foil/epoxy glass laminate strip was immersed into the bath for 1 minute, resulting in the deposition of about 0.2-0.3 mil coating which was dried and coalesced for 5 minutes at 80° C. The coating was imagewise exposed to UV light for 30 seconds (about 40 $mJ/cm^2$ on an EIT radiometer) and then developed by immersion in 1% NaOH until the exposed parts of the coating completely developed away, i.e. 1-2 minutes. The patterned coating was sufficiently resistant to etching in aqueous $CuCl_2$/HCl so that the pattern was etched into the underlying metal after about 2 minutes in a spray etching system.

EXAMPLE 16

An emulsion was prepared from a solution of 25 g of Charkit PR-12 positive photoresist, a 2-diazo-1-naphthoquinone-5-sulfonate ester of a t-butyl phenol/formaldehyde resin and 25 g of ethyl acetate from Charkit. To the above solution was added 0.16 g Triton X-100, followed by dropwise addition of 25 g deionized (DI) water. A solution of 0.5 g polystep A 16-22 surfactant in 35 g DI water was added dropwise, followed by 20 g of DI Water and a further solution of 0.6 g Polystep A16-22 surfactant in 40 g DI water. A water-in-oil emulsion resulted. Addition of 1 g Triton X-100 in 5 g ethyl acetate resulted in an oil-in-water emulsion. The emulsion was sonicated for 2 minutes at about 180 W estimated intensity with a Sonics and Materials 500 cell disrupter with a ¾ inch high gain Q horn. The low boiling ethyl acetate was removed on a rotary evaporator. The solids content of the emulsion was 17.5%. A deposition bath was prepared by diluting the emulsion to 8.4% total solids with water, adding an amount of phosphoric acid equal to 1% of the total bath weight and hydrogen peroxide equal to 1% of the total bath weight. A copper foil/epoxy glass laminate strip was immersed in the bath for 1 minute, and the resulting coating rinsed and dried. The coating was imagewise exposed through a positive pattern to UV light (90 $mJ/cm^2$) and developed by immersion in a 5:1 dilution of a positive photoresist developer from MacDermid to give a coated pattern corresponding to the positive pattern. After heating at 150° C. for 3 minutes, the patterned coating was sufficiently resistant to etching in a 10% $CuCl_2$/10% HCl bath at 60° C. to etch the coating pattern into the underlying metal.

EXAMPLE 17

A solution of 76.5 g HT 9690 novolak resin from Ciba-Geigy, 51.0 g HRJ 10805 novolak resin from Schenectady Chemicals, 22.5 g THBP-215 Diazo Ester from International Photochemicals, 15 g Hexyl Carbitol (hexyloxy ethoxy ethanol) from Union Carbide, and 150 g ethyl acetate was prepared.

To the stirred solution at room temperature was added dropwise, over 1.5 hours, a solution of 6.0 g Polystep A-16-22 surfactant in 224 g deionized water to form a water-in-oil emulsion. This step was followed by addition over 0.5 hours of a solution of 1.0 g Triton X-100 in 70 g deionized water to invert the emulsion to an oil-in-water (o/w) emulsion. The resulting o/w emulsion was sonicated for 2 minutes at about 180 W estimated intensity with a Sonics and Materials 500 W cell disrupter with a ¾" high gain Q horn. The ethyl acetate was removed on a rotary evaporator to give an emulsion containing 34.5% solids. A deposition bath was prepared by diluting the emulsion to 5% total solids with an aqueous phosphoric acid solution of pH 1.8 and adding an amount of hydrogen peroxide equal to 0.5% of the total bath weight.

A copper foil/epoxy glass laminate coupon was immersed in the bath for 1 minute, rinsed, and dried for 4 minutes at 100° C. to give a coalesced coating of a thickness of 0.2 to 0.3 mil. The coating was imagewise exposed to UV light through a positive pattern (90 $mJ/cm^2$) and immersed in a developer solution of 0.5% aqueous sodium hydroxide. The exposed area of the coating was developed to leave a coating corresponding to the positive pattern. The copper uncovered during developing was etched away with an acidic cupric chloride spray. The remaining coating was further exposed (without pattern) to UV light (200 mJ/cm$^2$) after which it was dissolved away by immersion in 0.5% aqueous sodium hydroxide to leave a copper pattern on the epoxy glass laminate corresponding to the imaging pattern.

EXAMPLE 18

A solution of a negative acting formulation was prepared with the following components:
280 g SMA 17352 styrene/maleic anhydride copolymer partially esterified with simple alkyl alcohols, e.g. methyl, butyl and isobutyl alcohol, from Sartomer Co.
100 g Sartomer 454 ethoxylated trimethylolpropane triacrylate
20 g Irgacure 651 photoinitiator from Ciba-Geigy
40 g PM Acetate from Eastman Chemicals
420 g ethyl acetate
To 100 g of the above solution was added 0.3 g Triton X-100 surfactant followed by 50 g water, dropwise with mechanical stirring to form a water-in-oil emulsion. A mixture of 0.9 g polystep p A16-22 surfactant from Stepan in 70 g water was then added dropwise to invert the emulsion to an oil-in-water (o/w) emulsion. The resulting o/w emulsion was sonicated for 2 minutes with a Sonics & Materials 500 W disruptor using a $\frac{3}{4}''$ high gain Q horn at an estimated 180 W intensity level. The ethyl acetate was then removed on a rotary evaporator.

A deposition bath was then prepared by diluting the emulsion to 10% solids with water, acidifying to pH 1.8 with phosphoric acid, and adding an amount of hydrogen peroxide equal to 1% of the total bath weight. Immersion of a copper foil/epoxy glass laminate strip in the bath for 20 seconds resulted in about 0.8 mil of coating which was dried and coalesced for 5 minutes at 80° C. The coating was imagewise exposed to UV light for 90 seconds (about 110 mJ/cm$^2$ on an EIT radiometer) and then developed by immersion in 0.5% NaOH until the exposed parts of the coating completely developed away, i.e. in 1-2 minutes. The patterned coating was sufficiently resistant to aqueous CuCl$_2$/HCl so that the pattern was etched into the underlying metal after about 2 minutes in a spray etching system.

EXAMPLE 19

A solution of a negative acting formulation was prepared with the following components:
23.2 g Scripset 550 styrene maleic anhydride copolymer esterfied with simple alkyl alcohols from Monsanto
7.4 g Photomer 4155 ethyoxylated trimethylol propane triacrylate from Henkel
7.4 g Sartomer 454 ethyoxylated trimethylol propane triacrylate from Sartomer
2.0 g Irgacure 651 photoinitiator from Ciba-Geigy
4.0 g PM Acetate from Eastman
93 g ethyl acetate
To the above solution was added 0.3 g Triton X-100 surfactant followed by 50 g water, dropwise with mechanical stirring to form a water-in-oil emulsion. A mixture of 0.9 g Stepan Polystep A16-22 surfactant in 70 g water was added dropwise to invert the emulsion into an oil-in-water (o/w) emulsion. The resulting o/w emulsion was sonicated for 2 minutes with a Sonics & Materials 500 W disruptor using a $\frac{3}{4}''$ high gain Q horn at an estimated 180 W intensity level. The ethyl acetate was then removed on a rotary evaporator.

A deposition bath was then prepared by diluting the emulsion to 10% solids with water, acidifying to pH 2.0 with phosphoric acid, and adding an amount of hydrogen peroxide equal to 0.3% of the total bath weight. Immersion of a copper foil/epoxy glass laminate strip in the bath for 30 seconds caused deposition of about 0.4 mil of coating which was dried and coalesced for 5 minutes at 80° C. The coating was imagewise exposed to UV light for 3 minutes (about 220 mJ/cm$^2$ on an EIT radiometer) and then developed by immersion in 0.5% NaOH until the exposed parts of the coating completely developed away, i.e. in 1-2 minutes. The patterned coating was sufficiently resistant to aqueous CuCl$_2$/HCl such that the pattern was etched into the underlying metal after about 2 minutes in a spray etching system.

EXAMPLE 20

A solution of a negative acting formulation was prepared with the following components:
36.0 g Joncryl 67 styrene/acrylic acid copolymer from Johnson Wax
11.0 g Sartomer 205 triethylene glycol dimethacrylate from Sartomer
4.0 g Sartomer 399 dipentaerythritol hydroxy pentaacrylate from Sartomer
2.0 g Irgacure 651 from Ciba-Geigy
0 4.0 g PM acetate from Eastman Chemical
60.0 g ethyl acetate
To the above solution was added 0.3 g Triton X-100 surfactant followed by 50 g water, dropwise with mechanical stirring to form a water-in-oil emulsion. A mixture of 0.9 g Polystep A16-22 surfactant from Stepan in 70 g water was added dropwise to invert the emulsion to form an oil-in-water (o/w) emulsion. The o/w emulsion was sonicated for 2 minutes with a Sonics & Materials 500 W disruptor using a $\frac{3}{4}''$ high gain Q horn at an estimated 180 W intensity level. The ethyl acetate was then removed on a rotary evaporator.

A deposition bath was then prepared by diluting the emulsion to 10% solids with water, acidifying to pH 2.0 with phosphoric acid, and adding an amount of hydrogen peroxide equal to 0.3% of the total bath weight. Immersion of a copper foil/epoxy glass laminate strip in the bath for 2 minutes caused deposition of about 1.0 mil of coating which was dried and coalesced for 5 minutes at 80° C. The coating was imagewise exposed to UV light for 1.5 minutes (about 110 mJ/cm$^2$ on an EIT radiometer) and then developed by immersion in 0.5% NaOH. The coating was developable but was not as cleanly developed as that for the coatings illustrated in Examples 18 and 19. As a result, the etching was retarded in some areas of the coated substrate in this example.

EXAMPLE 21

A solution of a negative acting formulation was prepared with the following components:
28.0 g Joncryl 67 from Johnson Wax
5.0 g Sartomer 454 ethoxylated trimethy propane triacrylate from Sartomer Co.
5.0 g Photomer 4155 ethyoxylated trimethylol propane triacrylate from Henkel
2.0 g Irgacure 651 from Ciba-Geigy
4.0 g PM acetate from Eastman
60.0 g ethyl acetate To the above solution was added 0.3 g Triton X-100 surfactant followed by 50 g water, dropwise with mechanical stirring to form a water-in-oil emulsion. A mixture of 0.9 g Stepan Polystep A16-22 surfactant in 70 g water was added dropwise to invert the emulsion to an oil-in-water (o/w) emulsion. The o/w emulsion was sonicated for 2 minutes with a Sonics & Materials 500 W disruptor using a ¾" high gain Q horn at an estimated 180 W intensity level. The ethyl acetate was then removed on a rotary evaporator.

A deposition bath was prepared by diluting the emulsion to 10% solids with water, acidifying to pH 2.0 with phosphoric acid, and adding an amount of hydrogen peroxide equal to 0.3% of the total bath weight. Immersion of a copper foil/epoxy glass laminate strip in the bath for 2 minutes caused deposition of about 0.8 mil of coating which was dried and coalesced for 5 minutes at 80° C. The coating was imagewise exposed to UV light for 3 minutes (about 220 mJ/cm$^2$ on an EIT radiometer) and then developed in a 1% $Na_2CO_3$ spray. The coating was developable but was not as cleanly developed as that for the coatings illustrated in Examples 18 and 19. As a result, the etching was retarded in some areas of the coated substrate in this example.

While the invention has been described with preferred embodiments, it is to be understood that variations and modifications may be resorted to as will be apparent to those skilled in the art. Such variations and modifications are to be considered within the purview and the scope of the claims appended hereto.

What is claimed:

1. Method of selectively coating a metallic surface, the method comprising
   (a) immersing said metallic surface in an autodepositable, acidic, aqueous photoresist emulsion having a pH of about 1 to 5 and having the capability of being developed by an aqueous base solution, said emulsion comprising
      (i) a water-insoluble acid-containing resin;
      (ii) a photoactive functionality;
      (iii) an acid;
      (iv) an oxidizing agent; and
      (v) a surfactant,
      wherein (i)-(v) are present in amounts and the surface is immersed for a period of time sufficient to autodeposit a coating of resin (i) and photoactive functionality (ii) on said metallic surface;
   (b) exposing said coating of resin (i) and photoactive functionality (ii) to actinic radiation in an imagewise fashion; and
   (c) immersing said exposed coated surface from (b) above in an aqueous base solution to develop an image on said surface.

2. A method according to claim 1 wherein said metallic surface is copper.

3. A method according to claim 2 wherein said copper surface is a layer in a laminate comprising at least one copper layer laminated onto a reinforcing layer.

4. A method according to claim 1 wherein photoactive functionality (ii) is a positive acting functionality.

5. A method according to claim 4 wherein the positive acting functionality is a member of the group consisting of polyoxymethylene, o-nitrocarbinol esters, o-nitrophenyl acetals and corresponding esters, benzoquinone diazide sulphonic esters, and naphthoquinone diazide sulphonic esters.

6. A method according to claim 4 wherein the positive acting functionality is o-nitrocarbinol ester and wherein the resin is an emulsion polymerization copolymer product of said nitrocarbinol ester with methyl methacrylate and acrylic acid.

7. A method according to claim 4 wherein the positive acting functionality is o-nitrocarbinol ester and wherein the resin is an emulsion polymerization copolymer product of said nitrocarbinol ester with vinylidene chloride.

8. A method according to claim 4 wherein the positive acting functionality is a 2-diazo-1-naphthoquinone sulfonate triester of 2,3,4-trihydroxy benzophenone and the resin is a novolak and wherein the functionality and resin are emulsified together as chemically separate components.

9. A method according to claim 4 wherein the positive acting functionality is 2-diazo-1-naphthoquinone sulfonate ester of a novolak resin.

10. A method according to claim 1 wherein the photoactive functionality (ii is a negative acting functionality and a photoinitiator.

11. A method according to claim 10 wherein the negative acting functionality comprises acrylate.

12. A method according to claim 10 wherein the negative acting functionality is an acrylate and the resin is a styrene/butadiene/methacrylic acid copolymer wherein the resin is in the form of a latex and the negative functionality is added thereto.

13. A method according to claim 11 wherein the acrylate is a member of the group consisting of
    ethyleneglycol diacrylate,
    ethyleneglycol dimethacrylate,
    propyleneglycol diacrylate,
    propyleneglycol dimethacrylate,
    trimethylolpropane triacrylate,
    trimethylolpropane ethoxylate triacrylate,
    trimethylolpropane propoxylate triacrylate,
    trimethylolpropane ethoxylate trimethacrylate,
    trimethylolpropane propoxylate trimethacrylate,
    bisphenol A diacrylate,
    phenoxyethyl methacrylate,
    hexanediol diacrylate,
    neopentylglycol diacrylate,
    neopentyl propoxylate diacrylate,
    pentaerythritol triacrylate,
    dipentaerythritol hydroxypentaacrylate, and
    polyethyleneglycol diacrylate.

14. A method according to claim 10 wherein the negative acting functionality is ethoxylated trimethylolpropane triacrylate and the resin is esterified styrene/maleic anhydride copolymer, and wherein the negative acting functionality and resin are emulsified together as chemically separate components.

15. A method according to claim 10 wherein the negative acting functionality is a mixture of dipentaerythritol hydroxypentacrylate and triethylene glycol dimethacrylate and the said resin is styrene/acrylic acid copolymer wherein the negative acting functionality and resin are emulsified together as chemically separate components.

16. A method according to claim 1 wherein the resin is a member of the group consisting of
    butadiene/acrylonitrile/methacrylic acid
    styrene/acrylic acid
    novolak
    styrene/butadiene/acrylic acid
    styrene/butadiene/methacrylic acid
    styrene/butadiene/itaconic acid
    styrene/butadiene/maleic acid styrene/butadiene/butylacrylate/acrylic acid
styrene/butadiene/butylacrylate/methacrylic acid
styrene/butadiene/butylacrylate/itaconic acid
styrene/butadiene/butylacrylate/maleic acid
styrene/ethyl acrylate/methacrylic acid
styrene/maleic anhydride
styrene/methacrylic acid and
vinylidene chloride/methacrylic acid.

17. A method according to claim 1 wherein the acid is a member of the group consisting of hydrochloric, hydrofluoric, phosphoric, citric, sulfuric and acetic acids.

18. A method according to claim 5 wherein the acid is a member of the group consisting of hydrochloric, hydrofluoric, phosphoric, citric, sulfuric and acetic acids.

19. A method according to claim 13 wherein the acid is a member of the group consisting of hydrochloric, hydrofluoric, phosphoric, citric, sulfuric and acetic acids.

20. A method according to claim 1 wherein the oxidizing agent is hydrogen peroxide.

21. A method according to claim 5 wherein the oxidizing agent is hydrogen peroxide.

22. A method according to claim 13 wherein the oxidizing agent is hydrogen peroxide.

23. A method according to claim 1 wherein said developer in step (c) is aqueous sodium hydroxide or sodium carbonate.

24. A method of making electrical circuit traces from a metallic surface, the method comprising
   (a) immersing said metallic surface in an autodepositable, acidic, aqueous photoresist emulsion having a pH of about 1 to 5 and the capability of being developed by an aqueous base solution, said method comprising
      (i) a water-insoluble acid-containing resin;
      (ii) a photoactive functionality;
      (iii) an acid;
      (iv) an oxidizing agent; and
      (v) a surfactant,
      wherein (i)–(v) are present in amounts and the surface is immersed for a period of time sufficient to autodeposit a coating of resin (i) and photoactive functionality (ii) on said metallic surface;
   (b) exposing said coating of resin (i) and photoactive functionality (ii) to actinic radiation in an imagewise fashion;
   (c) immersing said exposed coated metallic surface from (b) above in an aqueous base solution to develop an image on said metallic surface;
   (d) immersing the developed surface from (c) in an etchant bath to remove metallic surfaces which were uncovered during step (c); and
   (e) stripping any remaining coating in a solvent.

25. A method according to claim 24 wherein the metallic surface is copper.

26. A method according to claim 25 wherein said copper surface is a layer in a laminate comprising at least one layer of copper laminated onto a reinforcing layer.

27. A method according to claim 26 wherein said laminate has plated through holes.

28. A method according to claim 24 wherein the photoactive functionality (ii) is a positive acting functionality.

29. A method according to claim 28 wherein the positive acting functionality is a member of the group consisting of polyoxymethylene, o-nitrocarbinol esters, o-nitrophenyl acetals and corresponding esters, benzoquinone diazide sulphonic esters, and naphthoquinone diazide sulphonic esters.

30. A method according to claim 28 wherein the positive acting functionality is o-nitrocarbinol ester and wherein the resin is an emulsion polymerization copolymer product of said ester with methyl methacrylate and acrylic acid.

31. A method according to claim 28 wherein the positive acting functionality is o-nitrocarbinol ester and wherein the resin is an emulsion polymerization copolymer product of said ester with vinylidene chloride.

32. A method according to claim 28 wherein the positive acting functionality is a 2-diazo-1-naphthoquinone sulfonate triester of 2,3,4-trihydroxy benzophenone and the resin is a novolak and wherein the positive acting functionality and resin are emulsified together as chemically separate components.

33. A method according to claim 28 wherein the positive acting functionality is 2-diazo-1-naphthoquinone sulfonate ester of novolak resin.

34. A method according to claim 24 wherein the photoactive functionality (ii) is a negative acting functionality and a photoinitiator.

35. A method according to claim 34 wherein the negative acting functionality comprises acrylate.

36. A method according to claim 34 wherein the negative acting functionality is an acrylate and the resin is a styrene/butadiene/methacrylic acid copolymer and wherein the resin is in the form of a latex and the negative acting functionality is added thereto.

37. A method according to claim 35 wherein the acrylate is a member of the group consisting of
   ethyleneglycol diacrylate,
   ethyleneglycol dimethacrylate,
   propyleneglycol diacrylate,
   propyleneglycol dimethacrylate,
   trimethylolpropane triacrylate,
   trimethylolpropane ethoxylate triacrylate,
   trimethylolpropane propoxylate triacrylate,
   trimethylolpropane ethoxylate trimethacrylate,
   trimethylolpropane propoxylate trimethacrylate,
   bisphenol A diacrylate,
   phenoxyethyl methacrylate,
   hexanediol diacrylate,
   neopentylglycol diacrylate,
   neopentyl propoxylate diacrylate,
   pentaerythritol triacrylate,
   dipentaerythritol hydroxypentaacrylate and
   polyethyleneglycol diacrylate.

38. A method according to claim 34 wherein the negative acting functionality is ethoxylated trimethylolpropane triacrylate and the resin is esterified styrene/maleic anhydride copolymer and wherein the negative acting functionality and resin are emulsified together as chemically separate components.

39. A method according to claim 34 wherein the negative acting functionality is a mixture of dipentaerythritol hydroxypentacrylate and triethylene glycol dimethacrylate and the said resin is styrene/acrylic acid copolymer wherein the negative acting functionality and resin are emulsified together as chemically separate components.

40. A method according to claim 24 wherein the resin is a member of the group consisting of
   butadiene/acrylonitrile/methacrylic acid
   styrene/acrylic acid novolak
styrene/butadiene/acrylic acid
styrene/butadiene/itaconic acid
styrene/butadiene/maleic acid
styrene/butadiene/butylacrylate/acrylic acid
styrene/butadiene/butylacrylate/methacrylic acid
styrene/butadiene/butylacrylate/itaconic acid
styrene/butadiene/butylacrylate/maleic acid
styrene/ethyl acrylate/methacrylic acid
styrene/maleic anhydride
styrene/methacrylic acid and
vinylidene chloride/methacrylic acid.

41. A method according to claim 24 wherein the acid is a member of the group consisting of hydrochloric, hydrofluoric, phosphoric, citric, sulfuric and acetic acids.

42. A method according to claim 29 wherein the acid is a member of the group consisting of hydrochloric, hydrochloric, phosphoric, citric, sulfuric and acetic acids.

43. A method according to claim 37 wherein the acid is a member of the group consisting of hydrochloric, hydrofluoric, phosphoric, citric, sulfuric and acetic acids.

44. A method according to claim 24 wherein the oxidizing agent is hydrogen peroxide.

45. A method according to claim 29 wherein the oxidizing agent is hydrogen peroxide.

46. A method according to claim 37 wherein the oxidizing agent is hydrogen peroxide.

47. A method according to claim 24 wherein said developer solution in step (c) is aqueous sodium hydroxide or sodium carbonate.

* * * * *